US012628265B2

(12) United States Patent
Polidore et al.

(10) Patent No.: US 12,628,265 B2
(45) Date of Patent: May 12, 2026

(54) LOW PERMITTIVITY RADIO FREQUENCY SUBSTRATE, ASSEMBLY OF SAME, AND METHOD OF MAKING THE SAME

(71) Applicant: ROGERS CORPORATION, Chandler, AZ (US)

(72) Inventors: Trevor Polidore, Scottsdale, AZ (US); Karl Edward Sprentall, Medford, MA (US)

(73) Assignee: ROGERS CORPORATION, Chandler, AZ (US)

( * ) Notice: Subject to any disclaimer, the term of this patent is extended or adjusted under 35 U.S.C. 154(b) by 153 days.

(21) Appl. No.: 18/215,570

(22) Filed: Jun. 28, 2023

(65) Prior Publication Data

US 2025/0008640 A1     Jan. 2, 2025

(51) Int. Cl.
*H05K 1/02*          (2006.01)
(52) U.S. Cl.
CPC .................................. H05K 1/024 (2013.01)
(58) Field of Classification Search
CPC .... H05K 1/0284; H05K 1/024; H05K 1/0306; H05K 3/0011
See application file for complete search history.

(56) References Cited

U.S. PATENT DOCUMENTS

2003/0020655 A1     1/2003   McKinzie, III et al.
2004/0257279 A1     12/2004  Tebbe et al.

2008/0052904 A1     3/2008   Schneider et al.
2008/0149376 A1*    6/2008   Saito ......................... H01P 3/08
                                                          174/258
2009/0072930 A1     3/2009   Dutta
2019/0232555 A1     8/2019   Shaw et al.

OTHER PUBLICATIONS

Written Opinion issued for International Application No. PCT/US2023/026579; International Filing Date Jun. 29, 2023; Date of Mailing Mar. 13, 2024 (6 pages).
International Preliminary Report on Patentability for the corresponding International Application No. PCT/US2023/026579; International Filing Date: Jun. 29, 2023; Date of Mailing: Oct. 14, 2024; 18 pages.
International Search Report with English Translation and Written Opinion for International Application No. PCT/US2023/026579; International Filing Date Jun. 29, 2023; Date of Mailing Oct. 26, 2023; 14 pages.

* cited by examiner

*Primary Examiner* — Jeremy C Norris
(74) *Attorney, Agent, or Firm* — CANTOR COLBURN LLP

(57)          ABSTRACT

A substrate includes a monolithic structure formed from a dielectric material having a first side, a second side, and an intermediate region between the first side and the second side, and the intermediate region has a lattice structure of the dielectric material having a plurality of interstitial spaces between the dielectric material of the lattice structure. The lattice structure extends between and monolithically connects with the first side and the second side, wherein at least one of the first side and the second side has a substantially solid surface suitably configured to support one or more of electronic circuit imaging, electroplating, metal deposition, or, vias between the first side and the second side.

22 Claims, 9 Drawing Sheets

250

252     104

LOW PERMITTIVITY RADIO FREQUENCY SUBSTRATE, ASSEMBLY OF SAME, AND METHOD OF MAKING THE SAME

CROSS REFERENCE TO RELATED APPLICATIONS

This application claims the benefit of U.S. Provisional Application Ser. No. 63/357,386, filed Jun. 30, 2022, which is incorporated herein by reference in its entirety.

BACKGROUND

The present disclosure relates generally to a low permittivity radio frequency substrate, an assembly of the same, and a method of making the same.

Substrates having a low permittivity, or low Dk (dielectric constant), are often preferred to be used in certain RF (radio frequency) radiating elements like patch antennas. In these antenna constructions, as the Dk of the substrate decreases, a smaller portion of the electric field is confined and less energy is stored within the substrate, enabling higher radiation efficiency, wider bandwidth, and increased gain antennas. Materials used today to mimic air having a Dk=1, while providing rigidity and support for a printed antenna, are typically formed of foamed polymer materials. However, foam materials prohibit common fabrication techniques like plated vias for stacked patch designs and other multi-layered circuit designs. In addition, foam materials cannot be metalized and/or imaged directly on the surface since they are porous, so other circuit materials must be laminated to the foam surface causing additional processing complications. As such, end users either have to overcome the challenges of constructing a low Dk substrate system or use a higher Dk laminate.

Prior solutions have involved laminating circuit material to a foam spacer (typically imaged before to avoid process chemistry leeching into the foam), and running z-axis wires to connect the circuit planes on the top and bottom of the low Dk space (foam) since you cannot drill and plate vias.

While existing foamed polymer substrates useful in RF applications may be suitable for their intended purpose, the art relating to low permittivity RF substrates would be advanced with a substrate that overcomes one or more of the aforementioned limitations.

BRIEF SUMMARY

An embodiment includes a substrate, an assembly, and a method, as defined by the appended independent claims. Further advantageous modifications of the substrate, assembly, and method, are defined by the appended dependent claims.

An embodiment includes a substrate having: a monolithic structure formed from a dielectric material having a first side, a second side, and an intermediate region between the first side and the second side; wherein the intermediate region has a lattice structure of the dielectric material having a plurality of interstitial spaces between the dielectric material of the lattice structure; wherein the lattice structure extends between and monolithically connects with the first side and the second side; wherein at least one of the first side and the second side has a substantially solid surface suitably configured to support one or more of: electronic circuit imaging; electroplating; metal deposition; or, vias between the first side and the second side.

An embodiment includes a multi-layer assembly having two or more of the aforementioned substrate, wherein each of the substrate is mechanically attached, adhesively bonded, or fusion bonded, to an adjacent one of the substrate.

An embodiment includes a method of making the aforementioned substrate having the aforementioned monolithic structure wherein the method includes: in a continuous process, forming the first side of the substrate; via the continuous process, forming the intermediate region of the substrate on and monolithic with the first side, the intermediate region having the lattice structure of the dielectric material comprising the plurality of interstitial spaces between the dielectric material of the lattice structure; and via the continuous process, forming the second side of the substrate on and monolithic with the intermediate region.

The above features and advantages and other features and advantages of the invention are readily apparent from the following detailed description of the invention when taken in connection with the accompanying drawings.

BRIEF DESCRIPTION OF THE DRAWINGS

Referring to the exemplary non-limiting drawings wherein like elements are numbered alike in the accompanying Figures.

Figure 1A:
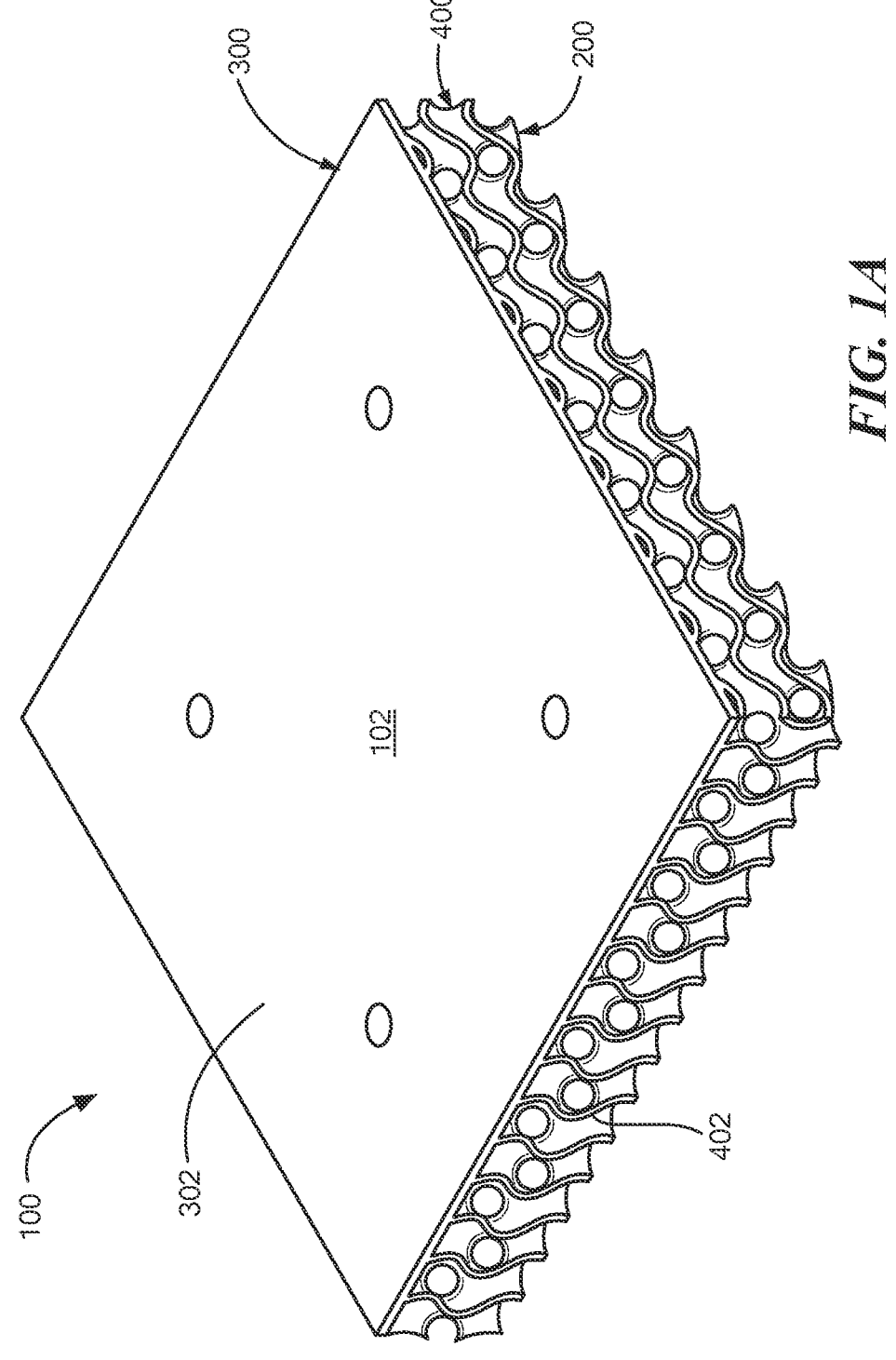
FIG. 1A depicts a rotated isometric view of a substrate, in accordance with an embodiment.

One skilled in the art will understand that the drawings, further described herein below, are for illustration purposes only. It will be appreciated that for simplicity and clarity of illustration, elements shown in the figures have not necessarily been drawn to scale. For example, the dimensions or scale of some of the elements may be exaggerated relative to other elements for clarity. Further, where considered appropriate, reference numerals may be repeated among the figures to indicate corresponding or analogous elements, or analogous elements may not be repetitively enumerated in all figures where it will be appreciated and understood that such enumeration where absent is inherently disclosed.

DETAILED DESCRIPTION

As used herein, the phrase "embodiment" means "embodiment disclosed and/or illustrated herein", which may not necessarily encompass a specific embodiment of an invention in accordance with the appended claims, but nonetheless is provided herein as being useful for a complete understanding of an invention in accordance with the appended claims.

Although the following detailed description contains many specifics for the purposes of illustration, anyone of ordinary skill in the art will appreciate that many variations and alterations to the following details are within the scope of the appended claims. For example, where described features may not be mutually exclusive of and with respect to other described features, such combinations of non-mutually exclusive features are considered to be inherently disclosed herein. Additionally, common features may be commonly illustrated in the various figures but may not be specifically enumerated in all figures for simplicity, but would be recognized by one skilled in the art as being an explicitly disclosed feature even though it may not be enumerated in a particular figure. Accordingly, the following example embodiments are set forth without any loss of generality to, and without imposing limitations upon, the claimed invention disclosed herein.

An embodiment, as shown and described by the various figures and accompanying text, provides a 3D-printable, or other additive manufacturing processes, substrate that uses a lattice structure to impart a low permittivity dielectric while also being configured to provide one or more substantially solid surfaces on either or both sides of the substrate for electrical circuit imaging, and to provide for inclusion of one or more vias in-situ. While an embodiment described and illustrated herein depicts a gyroid lattice structure as an example structure for the substrate disclosed herein, it will be appreciated that an invention disclosed herein and in accordance with the appended claims is not so limited, as other lattice structures as described herein may also be applicable for a purpose disclosed herein.

As used herein the term monolithic means a structure integrally formed from a single material composition and/or process absent material discontinuities from one region of the structure to another, such as a structure produced from a plastic molding process, a 3D printing process, a deposition process, or a machined process, for example.

As used herein, the term substantially is intended to account for manufacturing tolerances and/or minor deviations, such as vias, that do not detract from an intended performance or scope of an invention disclosed herein in accordance with the appended claims.

As described and illustrated herein, an embodiment includes a 3D printable substrate that uses a lattice structure to impart low permittivity while designed to have solid surfaces for circuit imaging and the ability to create vias in-situ.

In an embodiment, the substrate may comprise a 3D lattice of printed dielectric material with a solid printed film on one or both sides. In an embodiment, vias can be printed directly within the substrate by creating a solid cylindrical wall within the lattice that opens on both ends of the substrate. Printing a solid film on both sides may be employed when using ground planes or capacitively coupled patch elements within one part, but single (or double-sided) parts can be incorporated into other structures.

In an embodiment, the printed lattice may operate as a single dielectric medium since the features are much smaller than a fraction of the operating wavelength and can typically be lower than a few hundred microns.

In an embodiment, the lattice structure may be a gyroid lattice, with good mechanical stability and even density distribution within a cell.

Some advantages of an embodiment disclosed herein may include one or more of the following: a mechanically robust, low permittivity substrate, with solid, non-porous surfaces; integrally formed via structures to connect elements on either side of the substrate; a single monolithic structure, with better alignment, and lower Dk; no additional lamination processes needed; and, lower permittivity than other copper-clad laminates.

Reference is now be made to FIGS. 1A, 1B, 2A, 2B, 3A, and 3B, in combination.

In an embodiment, a substrate 100 includes a monolithic structure 102 formed from a dielectric material having a first side 200, a second side 300, and an intermediate region 400 between the first side 200 and the second side 300. In an embodiment, the intermediate region 400 has a lattice structure 403 of the dielectric material that has a plurality of interstitial spaces 402 (best seen with reference to FIG. 3A) between the dielectric material of the lattice structure 403, wherein the lattice structure 403 extends between and monolithically connects with the first side 200 and the second side 300. At least one of the first side 200 and the second side 300 includes a substantially solid surface 202, 302 suitably configured to support one or more of: electronic circuit imaging; electroplating; metal deposition (collectively herein referred to by reference numeral 250); or, vias 140 between the first side 200 and the second side 300. In an embodiment, the interstitial spaces 402 are fully or at least partially formed of air. In an embodiment, the monolithic structure 102 is not formed of a foam and/or is not a laminate structure. As used herein, the term laminate structure means a structure having separate and discrete layers that are fixed together to form a hard, flat, or flexible material. In an embodiment, the lattice structure 403 is a gyroid lattice structure, but may be any other surface-based lattice structure, as opposed to a strut-based lattice structure. In an embodiment, the lattice structure 403 of the intermediate region 400 has a uniform distribution of the dielectric material and the interstitial spaces 402.

In an embodiment, both the first side 200 and the second side 300 have substantially solid surfaces 202, 302 (best seen with reference to FIG. 2A) suitably configured to support one or more of: electronic circuit imaging; electroplating; metal deposition 250 (best seen with reference to FIG. 1B); or, vias 104 (best seen with reference to FIG. 3A) between the first side 200 and the second side 300. In an embodiment, the monolithic structure 102 of the substrate 100 includes one or more vias 104 that extend between the first side 200 and the second side 300 (best seen with reference to FIG. 3). In an embodiment, the one or more vias 104 have an electrically conductive (interior) surface that extends between the first side 200 and the second side 300 of the monolithic structure 102 that serves to provide at least one electrical conduction path between the first side 200 and the second side 300. In an embodiment, the first side 200, the second side 300, or both the first side 200 and the second side 300, of the monolithic structure 102, has a metallized surface to which the electrically conductive vias 104 are in electrical contact with. In an embodiment, the electrically conductive vias 104 and the metallized surfaces of the first and second sides 200, 300 are metallized together with the same metallizing process, such as metal vapor deposition for example.

In an embodiment, the dielectric material of the monolithic structure 102 of the substrate 100 has a relative dielectric constant equal to or greater than 1.01 and equal to or less than 5, or alternatively has a relative dielectric constant equal to or greater than 1.1 and equal to or less than 4.5.

Figure 3A:
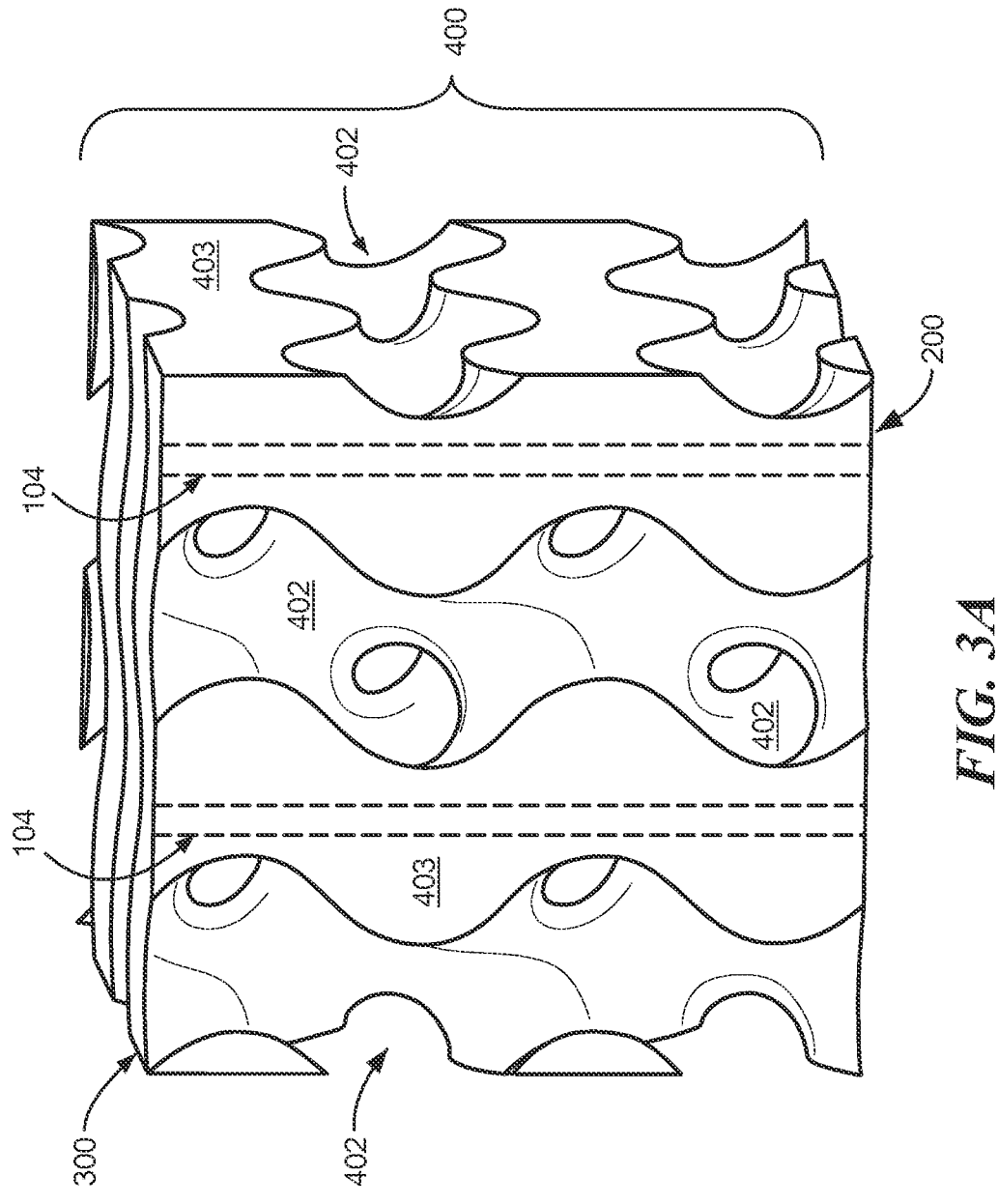
FIG. 3A depicts a rotated isometric view of an enlarged portion of the substrate of FIG. 1A depicting a surface-based lattice structure, in accordance with an embodiment.
Figure 3B:
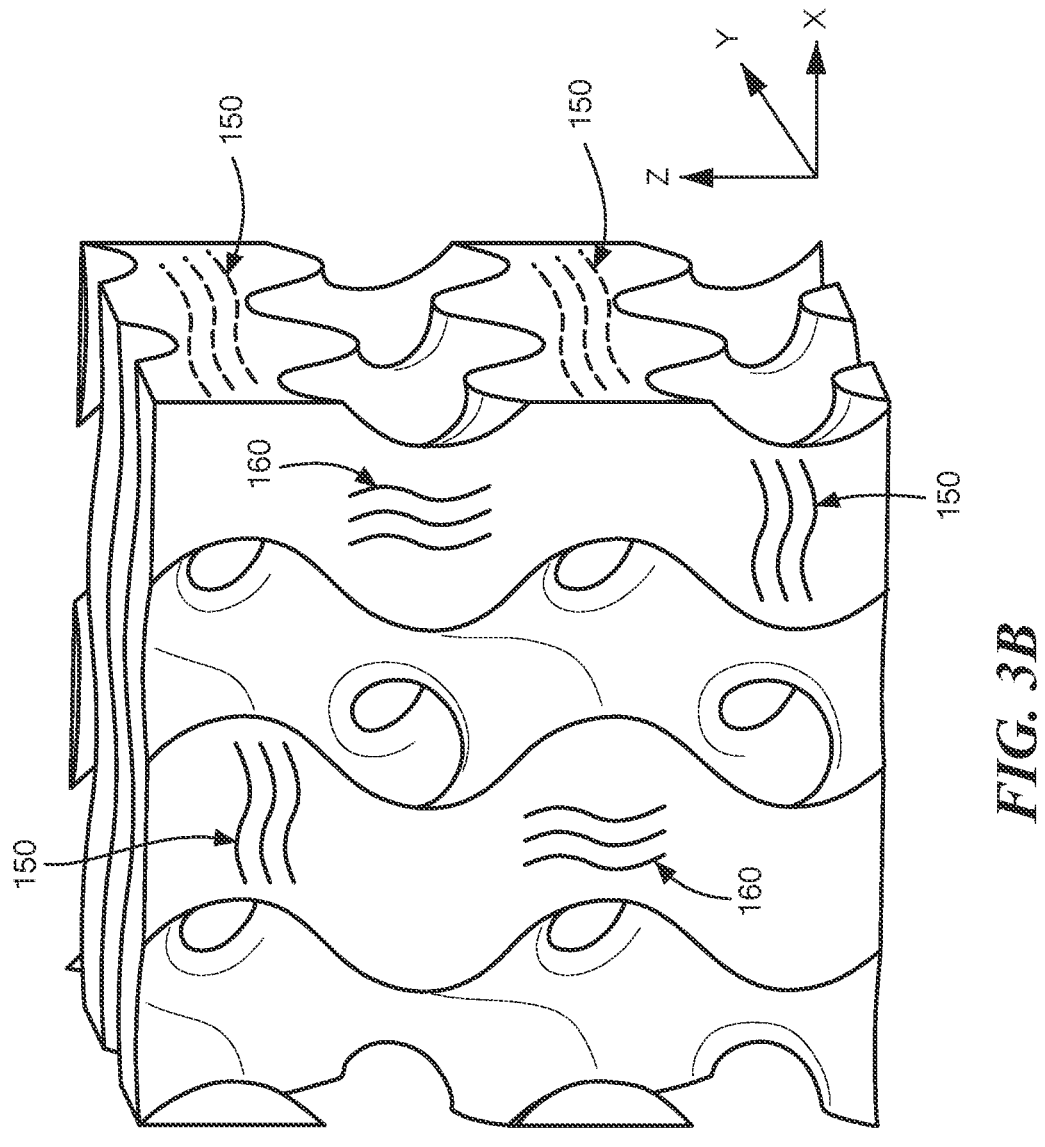
FIG. 3B depicts the rotated isometric view of FIG. 3A depicting ceramic fibers, in accordance with an embodiment.

In an embodiment, the monolithic structure 102 of the substrate 100 is formed relative to an orthogonal x-y-z coordinate system where the z-axis is perpendicular to both the first side 200 and the second side 300, and the dielectric material includes: ceramic fibers 150 that are substantially aligned with an x-y plane of the x-y-z coordinate system; ceramic fibers 160 substantially aligned with a z-axis of the x-y-z coordinate system; or, both ceramic fibers 150 substantially aligned with an x-y plane of the x-y-z coordinate system, and ceramic fibers 160 substantially aligned with a z-axis of the x-y-z coordinate system (best seen with reference to FIG. 3B). While FIG. 3B depicts only a few example arrangements, in quantity, width, and length, of the ceramic fibers 150, 160, it will be appreciated that these arrangements are for illustration purposes only, and that the quantity, width, and length, of such ceramic fibers 150, 160 may vary in accordance with desired performance characteristics, and in accordance with an embodiment disclosed herein.

Figure 1B:
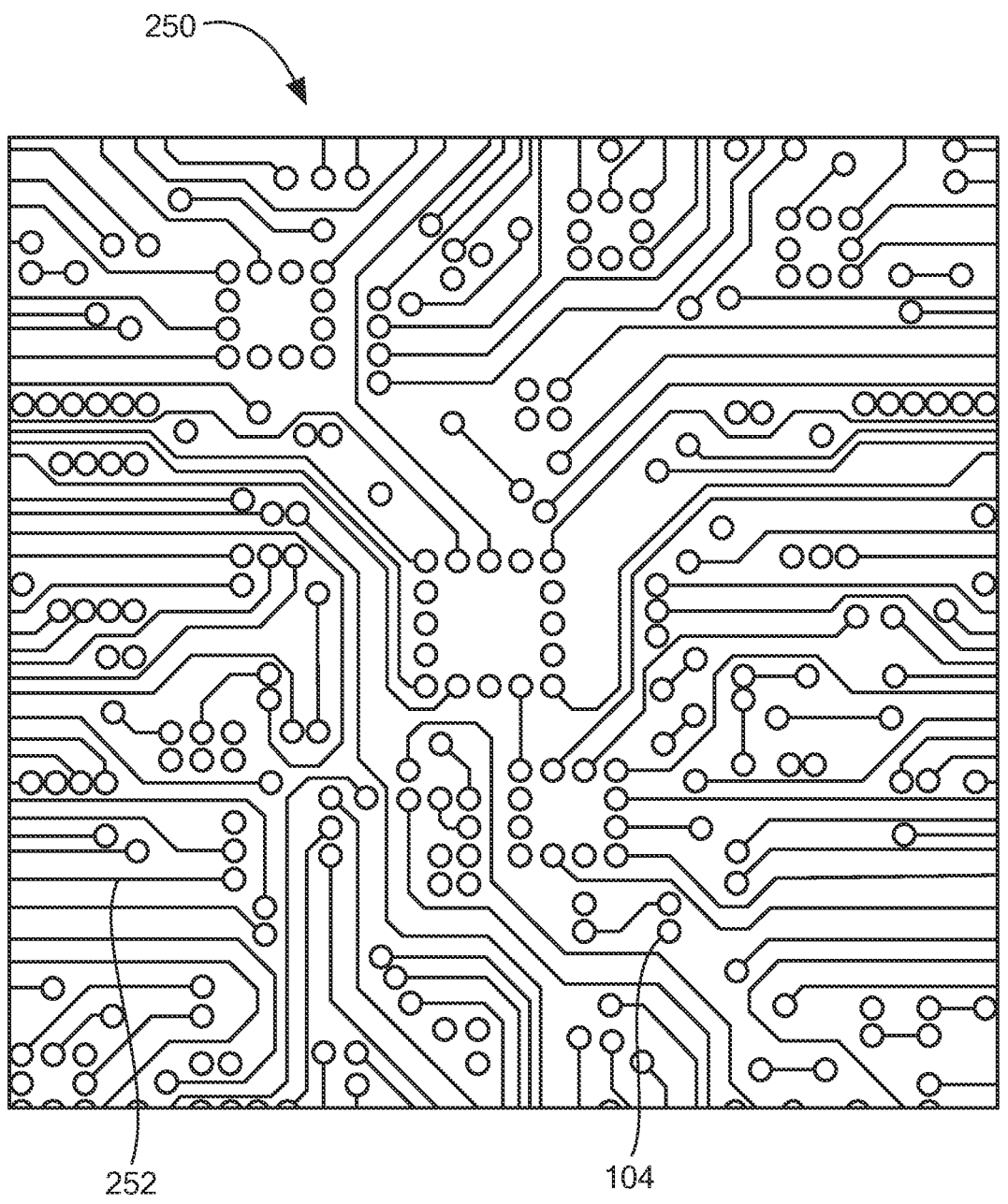
FIG. 1B depicts a plan view of example generic electronic circuitry representative of being suitable for use with the substrate of FIG. 1, in accordance with an embodiment.
Figures 2A, 2B:
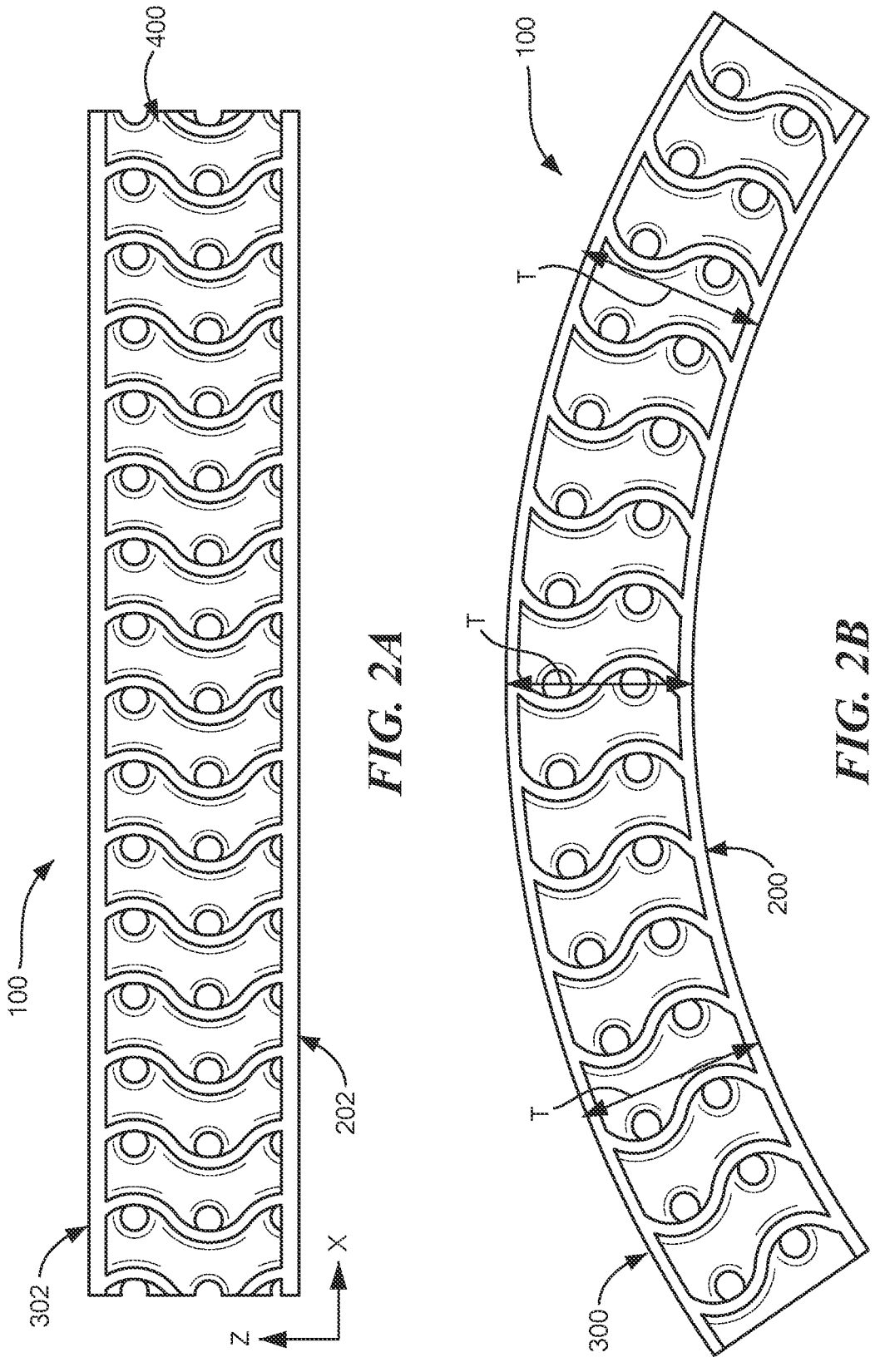
FIG. 2A depicts a cross section view of the substrate of FIG. 1A, in accordance with an embodiment.
FIG. 2B depicts an alternative cross section view to that of FIG. 2A, in accordance with an embodiment.

In an embodiment, the first side 200 of the substrate 100 is planar, the second side 300 of the substrate 100 is planar, and the second side 300 is parallel with the first side 200 (best seen with reference to FIGS. 1 and 2A). In another embodiment, the first side 200 of the substrate 100 is disposed equidistant at a distance "T" with respect to the second side 300 of the substrate 100, and in an embodiment, the first side 200 of the substrate 100 and the second side 300 of the substrate 100 are curved (best seen with reference to FIG. 2B).

In an embodiment, the monolithic structure 102 of the substrate 100 is formed relative to an orthogonal x-y-z coordinate system where the z-axis is perpendicular to both the first side 200 and the second side 300, and the substrate 100 is operational at a defined center frequency f having an operational wavelength λ, and the overall thickness of the substrate 100 in the z-direction is equal to or less than λ/2, or alternatively equal to or less than λ/4. In an example embodiment, the defined center frequency is 4.9 GHz, and the z-directional thickness of the substrate is 4.0 mm.

Reference is now made to FIGS. 4A, 4B, 4C, and 4D, in combination with FIGS. 1, 2A, 2B, 3A, and 3B.

Figure 4A:
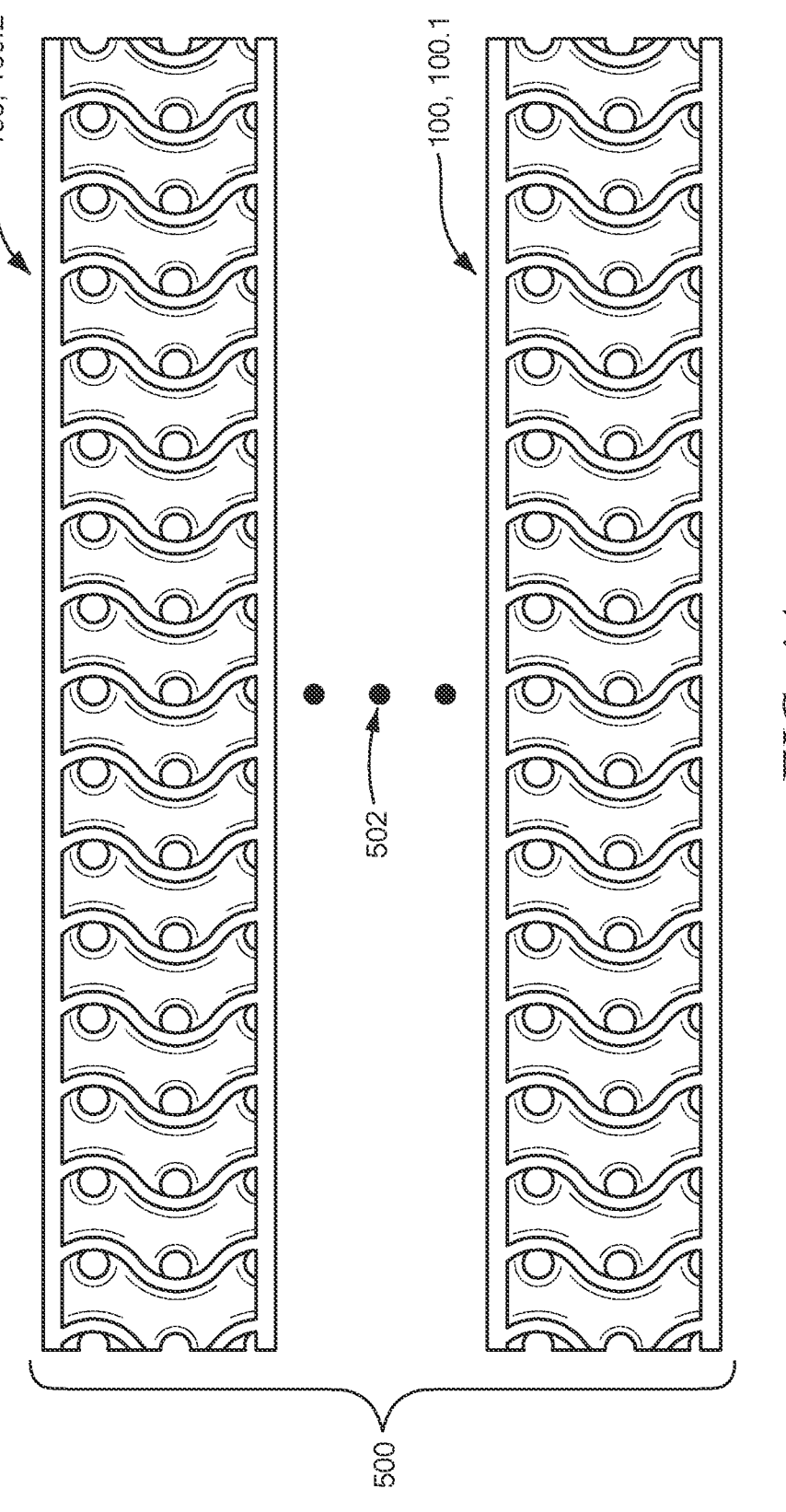
FIG. 4A depicts a cross section view of a disassembled multi-layer assembly of the substrate of FIG. 1A, in accordance with an embodiment.

In an embodiment, and as depicted in FIGS. 4A, 4B, 4C, and 4D, a multi-layer assembly 500 includes two or more of the substrate 100 described herein above and illustrated in FIGS. 1, 2A, 2B, 3A, and 3B (individually referred to by reference numerals 100.1, 100.2, etc., in FIGS. 4A 4B, 4C, and 4D), with multiple (i.e., two or more) substrates 100 being denoted by ellipses 502 in FIG. 4A.

Figure 4B:
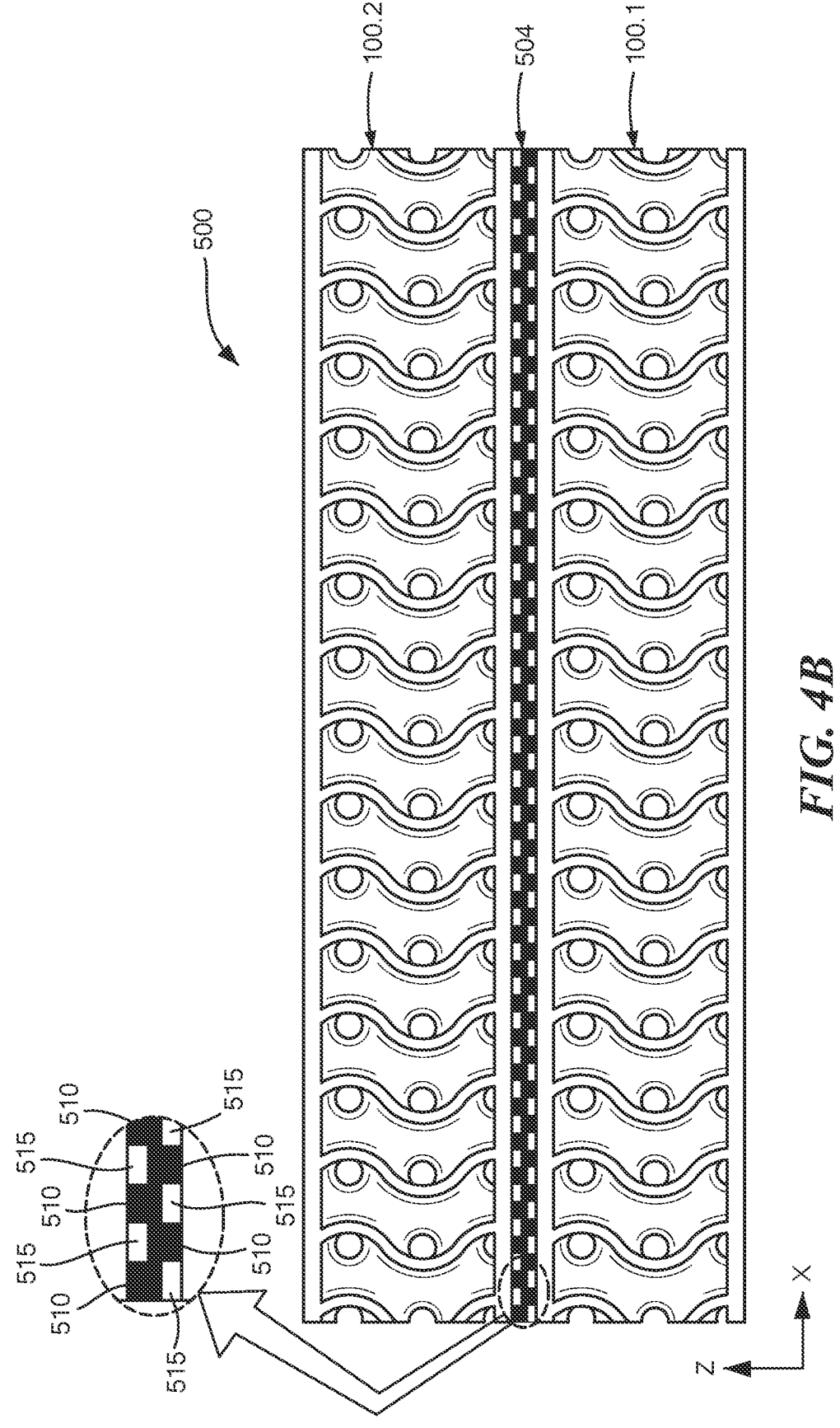
FIG. 4B depicts a cross section view of a multi-layer assembly having mechanically attached adjacent substrates, and an enlarged portion thereof, in accordance with an embodiment.

In an embodiment and with reference to FIG. 4B, one substrate 100.1 is mechanically attached to another adjacent substrate 100.2 via a mechanical attachment construct 504, such as interlocking elastically deformable projections 510 on each substrate, 100.1, 100.2, that are arranged in a one-to-one registration with corresponding elastically deformable recesses 515 on an adjacent one of each substrate, 100.1, 100.2, for example. Stated alternatively, each substrate 100.1, 100.2 has one or more mechanical registration features 510, 515 that mechanically attach and interlock with corresponding ones of mechanical registration features 515, 510 of an adjacent one of the substrate 100.1, 100.2. In an embodiment, the one or more mechanical registration features 510, 515 and corresponding ones of the mechanical registration features 515, 510 have an elastically deformable interference fit therebetween. In an embodiment, the elastically deformable projections 510 are completely or at least partially insertable within a corresponding one of the elastically deformable recesses 515.

Figure 4C:
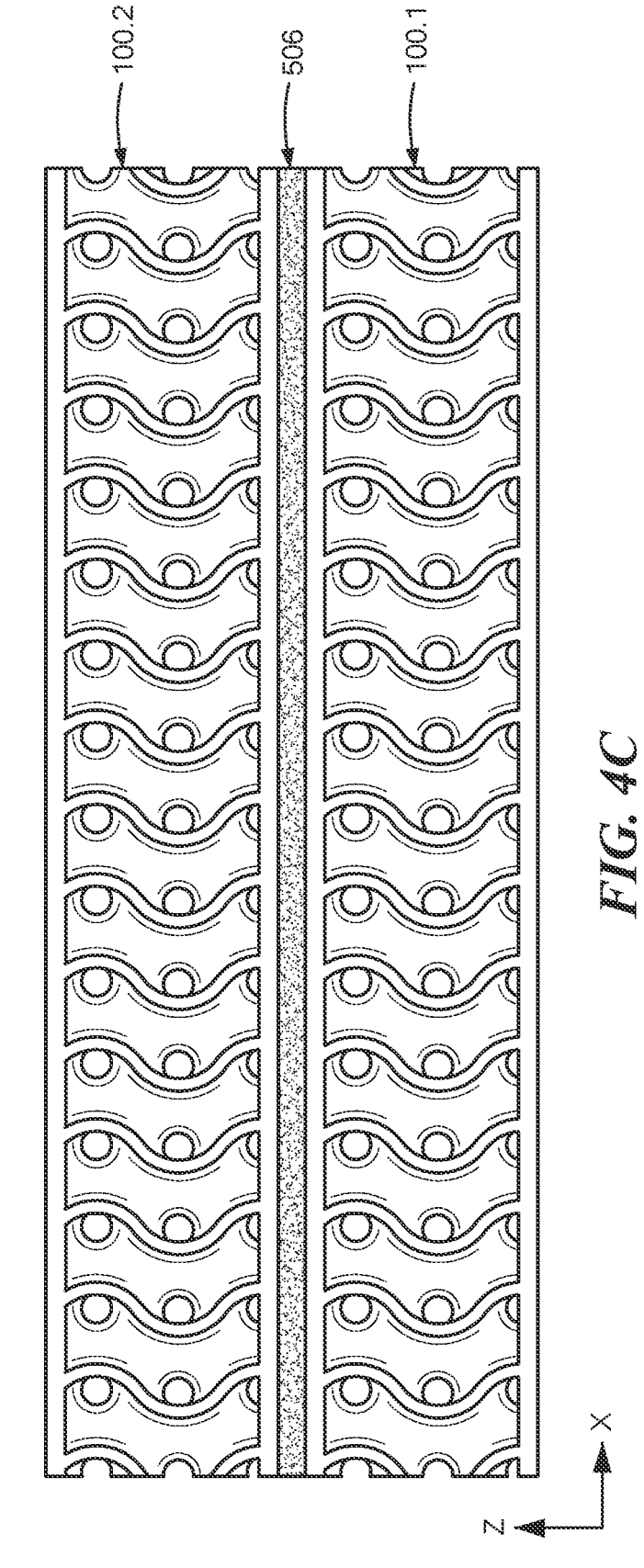
FIG. 4C depicts a cross section view similar to that of FIG. 4B but with adhesively bonded adjacent substrates, in accordance with an embodiment.

In an embodiment and with reference to FIG. 4C, one substrate 100.1 is adhesively bonded to another adjacent substrate 100.2 via an adhesive 506.

Figure 4D:
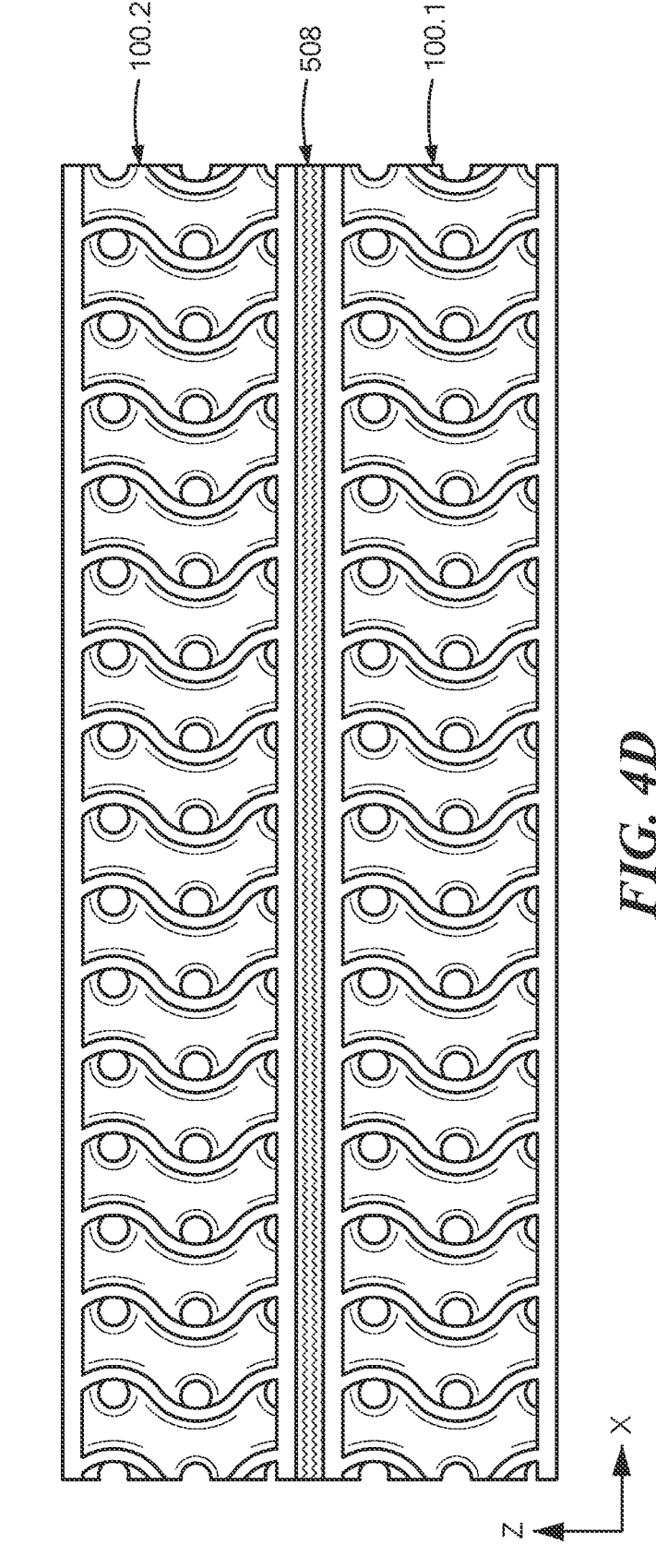
FIG. 4D depicts a cross section view similar to that of FIG. 4B but with fusion bonded adjacent substrates, in accordance with an embodiment.

In an embodiment and with reference to FIG. 4D, one substrate 100.1 is fusion bonded to another adjacent substrate 100.2 via a fusion bond interface 508.

In an embodiment, the multi-layer assembly 500 is configured such that each monolithic structure 102 is formed relative to an orthogonal x-y-z coordinate system where the z-axis is perpendicular to both the first side 200 and the second side 300, wherein the multi-layer assembly 500 is operational at a defined frequency f having an operational wavelength λ, and wherein the overall thickness of the multi-layer assembly 500 in the z-direction is equal to or less than λ/2, or alternatively is equal to or less than λ/4.

From all of the foregoing, it will be appreciated that in addition to the disclosure herein of a construct for a 3D-printable substrate 100 that uses a lattice structure 403 to impart a low permittivity dielectric to the substrate 100, also disclosed herein is method for making the same.

In an embodiment, a method of making the substrate 100 having the monolithic structure 102 as disclosed and illustrated herein, includes: in a continuous process, forming the first side 200 of the substrate 100; via the continuous process, forming the intermediate region 400 of the substrate 100 on and monolithic with the first side 100, the intermediate region 400 having the lattice structure 403 of the dielectric material having the plurality of interstitial spaces 402 between the dielectric material of the lattice structure 403; and, via the continuous process, forming the second side 300 of the substrate 100 on and monolithic with intermediate region 400.

In an embodiment of the method, the continuous process further includes forming one or more vias 104 that extend from the first side 200, through the intermediate region 400, to the second side 300.

In an embodiment, the method further includes imaging or metallizing electronic circuitry 250 on at least one of the first side 200 and the second side 300 to provide the electronic circuit imaging. FIG. 1B depicts a portion of generic electronic circuitry 250 having a plurality of electrically conductive trace lines 252, and a plurality of electrically conductive vias 104 (same reference numeral used for vias 104 depicted in FIG. 3A, as they would be electrically connected with each other), which may be employed in a manner disclosed herein.

In an embodiment, the method of making the substrate 100 includes forming the monolithic structure 102 relative to an orthogonal x-y-z coordinate system where the z-axis is perpendicular to both the first side 200 and the second side 300, wherein via the continuous process the method further includes forming within the dielectric material ceramic fibers 150 that are: substantially aligned with an x-y plane of the x-y-z coordinate system; substantially aligned with a z-axis of the x-y-z coordinate system; or, substantially aligned with an x-y plane of the x-y-z coordinate system, and substantially aligned with a z-axis of the x-y-z coordinate system.

7 8

In an embodiment, the continuous process involved in the method of making the substrate 100 includes any one of: 3D printing; stereolithography; light-based additive manufacturing; or, digital light processing with crosslinking of the dielectric material.

While certain combinations of individual features have been described and illustrated herein, it will be appreciated that these certain combinations of features are for illustration purposes only and that any combination of any of such individual features may be employed in accordance with an embodiment, whether or not such combination is explicitly illustrated, and consistent with the disclosure herein. Any and all such combinations of features as disclosed herein are contemplated herein, are considered to be within the understanding of one skilled in the art when considering the application as a whole, and are considered to be within the scope of the invention disclosed herein, as long as they fall within the scope of the invention defined by the appended claims, in a manner that would be understood by one skilled in the art.

While an invention has been described herein with reference to example embodiments, it will be understood by those skilled in the art that various changes may be made and equivalents may be substituted for elements thereof without departing from the scope of the claims. Many modifications may be made to adapt a particular situation or material to the teachings of the invention without departing from the essential scope thereof. Therefore, it is intended that the invention not be limited to the particular embodiment or embodiments disclosed herein as the best or only mode contemplated for carrying out this invention, but that the invention will include all embodiments falling within the scope of the appended claims. In the drawings and the description, there have been disclosed example embodiments and, although specific terms and/or dimensions may have been employed, they are unless otherwise stated used in a generic, exemplary and/or descriptive sense only and not for purposes of limitation, the scope of the claims therefore not being so limited. The use of the terms first, second, etc. do not denote any order or importance, but rather the terms first, second, etc. are used to distinguish one element from another. The use of the terms a, an, etc. do not denote a limitation of quantity, but rather denote the presence of at least one of the referenced item. The term "comprising" as used herein does not exclude the possible inclusion of one or more additional features. And, any background information provided herein is provided to reveal information believed by the applicant to be of possible relevance to the invention disclosed herein. No admission is necessarily intended, nor should be construed, that any of such background information constitutes prior art against an embodiment of the invention disclosed herein.

In view of all of the foregoing, it will be appreciated that various aspects of an embodiment are disclosed herein, which are in accordance with, but not limited to, at least the following aspects and/or combinations of aspects.

Aspect 1: A substrate, comprising: a monolithic structure formed from a dielectric material having a first side, a second side, and an intermediate region between the first side and the second side; wherein the intermediate region comprises a lattice structure of the dielectric material comprising a plurality of interstitial spaces between the dielectric material of the lattice structure; wherein the lattice structure extends between and monolithically connects with the first side and the second side; wherein at least one of the first side and the second side comprises a substantially solid surface suitably configured to support one or more of: electronic circuit imaging; electroplating; metal deposition; or, vias between the first side and the second side.

Aspect 2: The substrate of Aspect 1, wherein: the interstitial spaces comprise air.

Aspect 3: The substrate of any one of Aspects 1 to 2, wherein: the monolithic structure is not a foam material.

Aspect 4: The substrate of any one of Aspects 1 to 3, wherein: the monolithic structure is not a laminate structure.

Aspect 5: The substrate of any one of Aspects 1 to 4, wherein: both the first side and the second side comprise substantially solid surfaces suitably configured to support one or more of: electronic circuit imaging; electroplating; metal deposition; or, vias between the first side and the second side.

Aspect 6: The substrate of any one of Aspects 1 to 5, wherein: the dielectric material of the monolithic structure has a relative dielectric constant equal to or greater than 1.01 and equal to or less than 5.

Aspect 7: The substrate of Aspect 6, wherein: the dielectric material of the monolithic structure has a relative dielectric constant equal to or greater than 1.1 and equal to or less than 4.5.

Aspect 8: The substrate of any one of Aspects 1 to 7, wherein: the monolithic structure is formed relative to an orthogonal x-y-z coordinate system where the z-axis is perpendicular to both the first side and the second side; and, the dielectric material comprises ceramic fibers substantially aligned with an x-y plane of the x-y-z coordinate system.

Aspect 9: The substrate of any one of Aspects 1 to 7, wherein: the monolithic structure is formed relative to an orthogonal x-y-z coordinate system where the z-axis is perpendicular to both the first side and the second side; and, the dielectric material comprises ceramic fibers substantially aligned with a z-axis of the x-y-z coordinate system.

Aspect 10: The substrate of any one of Aspects 1 to 7, wherein: the monolithic structure is formed relative to an orthogonal x-y-z coordinate system where the z-axis is perpendicular to both the first side and the second side; the dielectric material comprises ceramic fibers substantially aligned with an x-y plane of the x-y-z coordinate system; and, the dielectric material comprises ceramic fibers substantially aligned with a z-axis of the x-y-z coordinate system.

Aspect 11: The substrate of any one of Aspects 1 to 10, wherein: the monolithic structure comprises one or more vias that extend between the first side and the second side.

Aspect 12: The substrate of Aspect 11, wherein: the one or more vias comprise an electrically conductive surface between the first side and the second side of the monolithic structure.

Aspect 13: The substrate of any one of Aspects 1 to 12, wherein: the lattice structure comprises a gyroid lattice structure.

Aspect 14: The substrate of any one of Aspects 1 to 13, further comprising: a metallized layer on the first side, the second side, or both the first side and the second side of the monolithic structure.

Aspect 15: The substrate of Aspect 14, further comprising the vias, wherein: the vias comprise an electrically conductive surface between the first side and the second side of the monolithic structure that are in electrical connection with the metallized layer of the first side, the second side, or both the first side and the second side.

Aspect 16: The substrate of any one of Aspects 1 to 15, wherein: the lattice structure is a surface-based lattice structure and not a strut-based lattice structure.

Aspect 17: The substrate of any one of Aspects 1 to 16, wherein: the lattice structure of the intermediate region has a uniform distribution of the dielectric material and the interstitial spaces.

Aspect 18: The substrate of any one of Aspects 1 to 17, wherein: the first side is planar, the second side is planar, and the second side is parallel with the first side.

Aspect 19: The substrate of any one of Aspects 1 to 17, wherein: the first side is disposed equidistant with respect to the second side.

Aspect 20: The substrate of Aspect 19, wherein: the first side and the second side are curved.

Aspect 21: The substrate of any one of Aspects 1 to 20, wherein: the monolithic structure is formed relative to an orthogonal x-y-z coordinate system where the z-axis is perpendicular to both the first side and the second side; and, the substrate is operational at a defined frequency f having an operational wavelength $\lambda$, and the overall thickness of the substrate in the z-direction is equal to or less than $\lambda/2$.

Aspect 22: The substrate of Aspect 21, wherein: the monolithic structure is formed relative to an orthogonal x-y-z coordinate system where the z-axis is perpendicular to both the first side and the second side; and, the substrate is operational at a defined frequency f having an operational wavelength $\lambda$, and the overall thickness of the substrate in the z-direction is equal to or less than $\lambda/4$.

Aspect 23: A multi-layer assembly, comprising: two or more of the substrate of any one of Aspects 1 to 22; wherein each of the substrate is mechanically attached, adhesively bonded, or fusion bonded, to an adjacent one of the substrate.

Aspect 24: The assembly of Aspect 23, wherein: each of the substrate comprises one or more mechanical registration features to mechanically attach and interlock with corresponding ones of mechanical registration features of an adjacent one of the substrate.

Aspect 25: The assembly of Aspect 24, wherein: the one or more mechanical registration features and the corresponding ones of mechanical registration features comprise an elastically deformable interference fit therebetween.

Aspect 26: The assembly of any one of Aspects 23 to 25, wherein: the monolithic structure is formed relative to an orthogonal x-y-z coordinate system where the z-axis is perpendicular to both the first side and the second side; and, the assembly is operational at a defined frequency f having an operational wavelength $\lambda$, and the overall thickness of the assembly in the z-direction is equal to or less than $\lambda/2$.

Aspect 27: The assembly of any one of Aspects 23 to 25, wherein: the monolithic structure is formed relative to an orthogonal x-y-z coordinate system where the z-axis is perpendicular to both the first side and the second side; and, the assembly is operational at a defined frequency f having an operational wavelength $\lambda$, and the overall thickness of the assembly in the z-direction is equal to or less than $\lambda/4$.

Aspect 28: A method of making the substrate having the monolithic structure of any one of Aspects 1 to 22, the method comprising: in a continuous process, forming the first side of the substrate; via the continuous process, forming the intermediate region of the substrate on and monolithic with the first side, the intermediate region having the lattice structure of the dielectric material comprising the plurality of interstitial spaces between the dielectric material of the lattice structure; and, via the continuous process, forming the second side of the substrate on and monolithic with the intermediate region.

Aspect 29: The method of Aspect 28, wherein: the continuous process further includes forming one or more vias that extend from the first side, through the intermediate region, to the second side.

Aspect 30: The method of any one of Aspects 28 to 29, further comprising: imaging electronic circuitry on at least one of the first side and the second side to provide the electronic circuit imaging.

Aspect 31: The method of any one of Aspects 28 to 29, further comprising: metallizing electronic circuitry on at least one of the first side and the second side to provide the electronic circuit imaging.

Aspect 32: The method of any one of Aspects 28 to 31, wherein the monolithic structure is formed relative to an orthogonal x-y-z coordinate system where the z-axis is perpendicular to both the first side and the second side, the method further comprising: via the continuous process, forming within the dielectric material ceramic fibers that are substantially aligned with an x-y plane of the x-y-z coordinate system.

Aspect 33: The method of any one of Aspects 28 to 31, wherein the monolithic structure is formed relative to an orthogonal x-y-z coordinate system where the z-axis is perpendicular to both the first side and the second side, the method further comprising: via the continuous process, forming within the dielectric material ceramic fibers that are substantially aligned with a z-axis of the x-y-z coordinate system.

Aspect 34: The method of any one of Aspects 28 to 31, wherein the monolithic structure is formed relative to an orthogonal x-y-z coordinate system where the z-axis is perpendicular to both the first side and the second side, the method further comprising: via the continuous process, forming within the dielectric material ceramic fibers that are substantially aligned with an x-y plane of the x-y-z coordinate system; and, via the continuous process, forming within the dielectric material ceramic fibers that are substantially aligned with a z-axis of the x-y-z coordinate system.

Aspect 35: The method of any one of Aspects 28 to 34, wherein: the continuous process comprises any one of: 3D printing; stereolithography; light-based additive manufacturing: or, digital light processing with crosslinking of the dielectric material.

The invention claimed is:

1. A substrate, comprising:

a monolithic structure formed from a dielectric material having a first side, a second side, and an intermediate region between the first side and the second side, the intermediate region on and monolithic with the first side, and the second side on and monolithic with the intermediate region;

wherein the intermediate region comprises a lattice structure of the dielectric material comprising a plurality of interstitial spaces between the dielectric material of the lattice structure;

wherein the lattice structure extends between and monolithically connects with the first side and the second side;

wherein at least one of the first side and the second side comprises a substantially solid surface suitably configured to support one or more of: electronic circuit imaging; electroplating; metal deposition; or, vias between the first side and the second side, wherein the lattice structure is a surface-based lattice structure and not a strut-based lattice structure.

2. The substrate of claim 1, wherein:

the interstitial spaces comprise air.

3. The substrate of claim 1, wherein:

the monolithic structure is not a foam material.

4. The substrate of claim 1, wherein:

the monolithic structure is not a laminate structure.

5. The substrate of claim 1, wherein:

both the first side and the second side comprise substantially solid surfaces suitably configured to support one or more of: electronic circuit imaging; electroplating; metal deposition; or, vias between the first side and the second side.

6. The substrate of claim 1, wherein:

the dielectric material of the monolithic structure has a relative dielectric constant equal to or greater than 1.01 and equal to or less than 5.

7. The substrate of claim 1, wherein:

the monolithic structure is formed relative to an orthogonal x-y-z coordinate system where the z-axis is perpendicular to both the first side and the second side; and the dielectric material comprises ceramic fibers substantially aligned with an x-y plane of the x-y-z coordinate system.

8. The substrate of claim 1, wherein:

the monolithic structure is formed relative to an orthogonal x-y-z coordinate system where the z-axis is perpendicular to both the first side and the second side; and the dielectric material comprises ceramic fibers substantially aligned with a z-axis of the x-y-z coordinate system.

9. The substrate of claim 1, wherein:

the monolithic structure is formed relative to an orthogonal x-y-z coordinate system where the z-axis is perpendicular to both the first side and the second side;

the dielectric material comprises ceramic fibers substantially aligned with an x-y plane of the x-y-z coordinate system; and the dielectric material comprises ceramic fibers substantially aligned with a z-axis of the x-y-z coordinate system.

10. The substrate of claim 1, wherein:

the monolithic structure comprises one or more vias that extend between the first side and the second side.

11. The substrate of claim 10, wherein:

the one or more vias comprise an electrically conductive surface between the first side and the second side of the monolithic structure.

12. The substrate of claim 1, wherein:

the lattice structure comprises a gyroid lattice structure.

13. The substrate of claim 1, further comprising:

a metallized layer on the first side, the second side, or both the first side and the second side of the monolithic structure.

14. The substrate of claim 13, further comprising the vias, wherein:

the vias comprise an electrically conductive surface between the first side and the second side of the monolithic structure that are in electrical connection with the metallized layer of the first side, the second side, or both the first side and the second side.

15. The substrate of claim 1, wherein:

the lattice structure of the intermediate region has a uniform distribution of the dielectric material and the interstitial spaces.

16. The substrate of claim 1, wherein:

the first side is planar, the second side is planar, and the second side is parallel with the first side.

17. The substrate of claim 1, wherein:

the first side is disposed equidistant with respect to the second side.

18. The substrate of claim 17, wherein:

the first side and the second side are curved.

19. The substrate of claim 1, wherein:

the monolithic structure is formed relative to an orthogonal x-y-z coordinate system where the z-axis is perpendicular to both the first side and the second side; and the substrate is operational at a defined frequency f having an operational wavelength $\lambda$, and the overall thickness of the substrate in the z-direction is equal to or less than $\lambda/2$.

20. The substrate of claim 19, wherein:

the monolithic structure is formed relative to an orthogonal x-y-z coordinate system where the z-axis is perpendicular to both the first side and the second side; and the substrate is operational at a defined frequency f having an operational wavelength $\lambda$, and the overall thickness of the substrate in the z-direction is equal to or less than $\lambda/4$.

21. A multi-layer assembly, comprising:

two or more of the substrate of claim 1;

wherein each of the substrate is mechanically attached, adhesively bonded, or fusion bonded, to an adjacent one of the substrate;

wherein the monolithic structure is formed relative to an orthogonal x-y-z coordinate system where the z-axis is perpendicular to both the first side and the second side; and wherein the assembly is operational at a defined frequency f having an operational wavelength $\lambda$, and the overall thickness of the assembly in the z-direction is equal to or less than $\lambda/4$.

22. A method of making the substrate having the monolithic structure, the method comprising:

forming, from a dielectric material, a monolithic structure having a first side, a second side, and an intermediate region between the first side and the second side, wherein forming the monolithic structure comprises:

in a continuous process, forming the first side of the substrate;

via the continuous process, forming the intermediate region of the substrate on and monolithic with the first side, the intermediate region having the lattice structure of the dielectric material comprising the plurality of interstitial spaces between the dielectric material of the lattice structure; and via the continuous process, forming the second side of the substrate on and monolithic with the intermediate region;

wherein the continuous process comprises any one of: 3D printing; stereolithography; light-based additive manufacturing; or, digital light processing with crosslinking of the dielectric material, wherein at least one of the first side and the second side comprises a substantially solid surface suitably configured to support one or more of: electronic circuit imaging; electroplating; metal deposition; or, vias between the first side and the second side.

\* \* \* \* \*